(12) United States Patent
Inada

(10) Patent No.: US 7,282,428 B2
(45) Date of Patent: Oct. 16, 2007

(54) METHOD FOR SOLID PHASE DIFFUSION OF ZINC INTO AN INP-BASED PHOTODIODE AND AN INP PHOTODIODE MADE WITH THE METHOD

(75) Inventor: Hiroshi Inada, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 64 days.

(21) Appl. No.: 11/270,579

(22) Filed: Nov. 10, 2005

(65) Prior Publication Data

US 2006/0105554 A1 May 18, 2006

(30) Foreign Application Priority Data

Nov. 16, 2004 (JP) .............................. 2004-331352

(51) Int. Cl.
*H01L 21/225* (2006.01)
(52) U.S. Cl. .............................. 438/559; 257/E21.144; 257/E21.152; 257/461
(58) Field of Classification Search ................ 438/542, 438/551, 552, 555, 559; 257/E21.144, 152
See application file for complete search history.

(56) References Cited

U.S. PATENT DOCUMENTS 5,041,888 A * 8/1991 Possin et al. .................. 257/59
5,116,781 A * 5/1992 Agostinelli et al. ......... 438/559
5,935,764 A * 8/1999 Kakehashi .................... 430/314
6,888,180 B2 * 5/2005 Kotani et al. ................ 257/191

FOREIGN PATENT DOCUMENTS

| JP | 05-234927 A | 9/1993 |
| JP | 09-51119 A | 2/1997 |
| JP | 2002-299679 A | 10/2002 |

OTHER PUBLICATIONS

Kovacs et al., Bulk Micromachining of Silicon, Proceedings of the IEEE, vol. 86, p. 1536-1551, 1998.*

* cited by examiner

*Primary Examiner*—B. William Baumeister
*Assistant Examiner*—Minchul Yang
(74) *Attorney, Agent, or Firm*—Global IP Counselors, LLP

(57) ABSTRACT

In order to form a p-region in an InP-based photodiode, zinc doping must be performed. Due to the current trend toward the implementation of larger-sized InP wafers, there is a need for a solid phase diffusion method in which a ZnO thin film is applied to an epitaxial wafer, the wafer is heated, such that zinc is diffused from the ZnO thin film into the InP epitaxial layers. A mask having an upper layer made of a-Si is used as a diffusion mask. Since a-Si does not dissolve in hydrofluoric acid, the a-Si remains without dissolving when the ZnO is removed with hydrofluoric acid. Since the a-Si film remains, the edge of the pn junction is not exposed. The pn junction does not become degraded because the edge of the pn junction is covered and protected by the diffusion mask at all times.

13 Claims, 9 Drawing Sheets

FIG. 1

Figure 3:
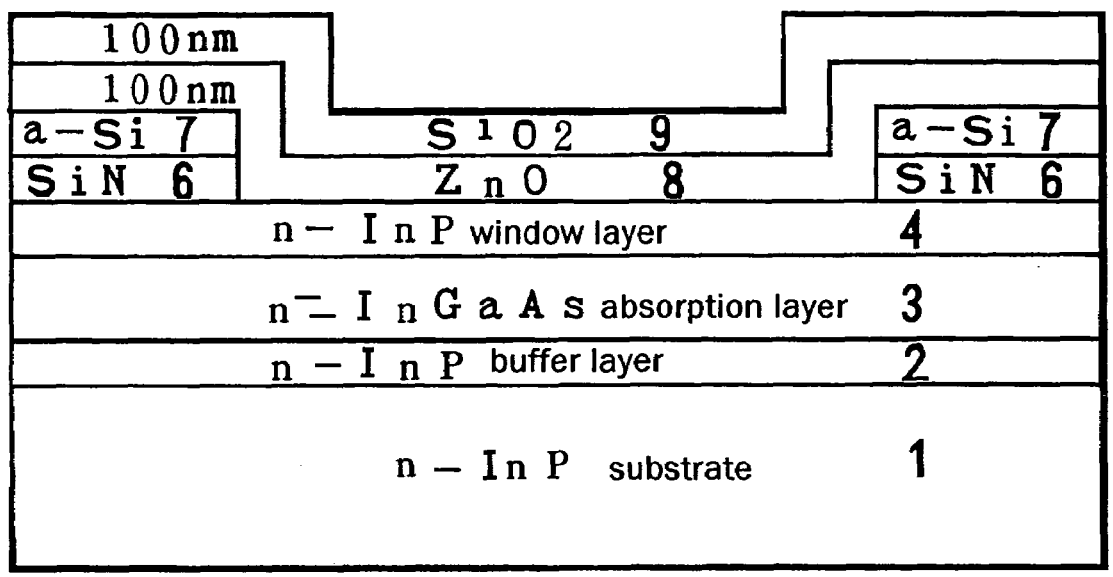

| 100 nm | a – S i | 7 |
|---|---|---|
| 100 nm | S i N | 6 |
| n – I n P window layer | | 4 |
| n – I n GaAs absorption layer | | 3 |
| n – I n P buffer layer | | 2 |
| n – I n P substrate | | 1 |

FIG. 2

| a-Si 7 | Opening 10 | Etching with hydrofluoric acid and nitric acid | Cover 19 a-Si 7 |
|---|---|---|---|
| SiN 6 | | | SiN 6 |
| n – I n P window layer | | | 4 |
| n – I n G a A s absorption layer | | | 3 |
| n – I n P buffer layer | | | 2 |
| n – I n P substrate | | | 1 |

FIG. 11

Epitaxial wafer

| | |
|---|---|
| n – I n P   window layer | 4 |
| n⁻ – I n G a A s   absorption layer | 3 |
| n – I n P   buffer layer | 2 |
| n – I n P   substrate | 1 |

FIG. 12

Conventional example

| | |
|---|---|
| S i N | 6 |
| n – I n P   window layer | 4 |
| n⁻ – I n G a A s   absorption layer | 3 |
| n – I n P   buffer layer | 2 |
| n – I n P   substrate | 1 |

METHOD FOR SOLID PHASE DIFFUSION OF ZINC INTO AN INP-BASED PHOTODIODE AND AN INP PHOTODIODE MADE WITH THE METHOD

BACKGROUND OF THE INVENTION

1. Field of the Invention

The present invention relates to a method for solid phase diffusion of zinc into an InP-based photodiode and an InP-based photodiode made with the method.

2. Description of the Background Art

InP-based photodiodes are p-i-n photodiodes and avalanche photodiodes for sensing near-infrared light (wavelength: 1.3 to 1.6 µm) in optical communication applications. The absorption layer is a compound crystal of $In_xGa_{1-x}As$ (where 0<x<1) or a compound crystal of $In_xGa_{1-x}As_{1-y}P_y$ (where 0<x, y<1). Hereinafter, the mixture ratios "x" and "y" are omitted for the sake of brevity. InGaAs compounds are used more often although InGaAsP absorption layers are sometimes used depending on the wavelength of the light to be absorbed These photodiodes are called InP-based photodiodes because the substrate is made of InP and the absorption layer contains InP. In the subsequent explanation, the absorption layer is described as an InGaAs absorption layer because the explanation would become complicated if InGaAs and InGaAsP were both mentioned simultaneously. However, the term InGaAs absorption layer includes both InGaAs absorption layers and InGaAsP absorption layers, and description of the InGaAs absorption layer is applicable to both of InGaAs absorption layers and InGaAsP absorption layers.

When an InP photodiode is manufactured, an n-InP buffer layer, an InGaAs absorption layer, an n-InP window layer, and the like are epitaxially grown onto an n-type substrate. The perimeter of the top surface is then covered with a mask and zinc is selectively diffused through the opening of the mask to form a dish-shaped p-region.

Group IIb elements such as Zn and Cd are used as the p-type dopant for forming the p-region of the InP photodiode. Zn is used most frequently. The epitaxial method, the ion implantation method, or the thermal diffusion method can be used to form a pn junction in a semiconductor layer.

When the epitaxial method is used, a p-type layer is epitaxially grown on an n-type layer or an i-type layer, such that the boundary layer therebetween forms the pn junction. With this method, a p-region having a dish-shaped cross section cannot be made.

When the ion implantation method is used, ions of a p-type dopant are accelerated and shot into an n-type layer or an i-type layer. Since the ions can be implanted selectively by attaching a mask, a p-region can be formed on a limited area. The impact of high-speed ions disturbs the crystalline structure. Therefore, the regularity of the crystal is restored by annealing.

Neither the ion implantation method nor the epitaxial growth method is particularly well suited to forming the p-region of a photodiode. The p-regions of photodiodes are made almost exclusively by the thermal diffusion method. Thermal diffusion is a process in which a p-type impurity is put in physical contact with a semiconductor layer and heat is applied such that particles of the impurity are drawn to inside the semiconductor layer due to a concentration gradient. Thermal diffusion is categorized into vapor phase diffusion, liquid phase diffusion, and solid phase diffusion, based on the physical state of the p-type impurity. Liquid phase diffusion is difficult to employ in the case of InP photodiodes because there are not any suitable substances in which Zn can be dissolved to make a liquid solution.

Consequently, the p-regions of InP photodiodes have been formed almost exclusively by vapor phase diffusion. The vapor phase diffusion methods include the closed tube method and the open tube method.

The closed tube method of the vapor phase diffusion has been used conventionally. Today, the closed tube method is the most commonly employed method. The closed tube method involves covering an n-type InP wafer with an $SiO_2$ mask having a window, and then placing the n-type InP wafer, together with solid phosphorous (P) and a Zn compound that serves as a dopant, into a quartz tube that has been pulled to a vacuum. The Zn compound is heated to a vapor and the gaseous Zn compound is put into contact with the InP wafer through the window of the mask. The Zn diffuses into the epitaxial wafer in the vapor phase. $ZnCl_2$ or other compound that sublimates readily is used as the Zn compound. The solid phosphorous (P) is maintained at a lower temperature in order to balance against the disassociation pressure of the phosphorous from the InP wafer and prevent phosphorous from escaping from the surface of the InP wafer. When semiconductors made of elements in Groups 3 to 5 are raised to high temperatures, the disassociation pressure of Group 5 elements becomes high and the escape of Group 5 elements becomes particularly prominent. Therefore, a high vapor pressure of the Group 5 element is created inside the quartz tube so that the vapor pressure and the disassociation pressure of the Group 5 element are in balance. A closed tube is particularly well suited for maintaining such a balance.

The amount of Zn to be diffused (diffusion depth) can be controlled based on the temperature and the amount of time. Once a prescribed amount of time elapses, the quartz tube is broken and the wafer is removed. The wafer thus removed has a p-region and a pn junction formed thereon. The process is called "vapor phase diffusion" because the Zn is in the vapor phase. The method is called the "closed tube method" because the process is conducted inside a closed quartz tube. This method has a long history of success, is an excellent method, and is still used almost exclusively today.

The closed tube method can be employed to manufacture 2-inch diameter InP wafers. However, when the diameter of the InP wafer is larger, such as 3 or 4 inches, it becomes difficult to conduct Zn diffusion with the closed tube method. This is because as the wafer diameter becomes larger, a larger quartz tube becomes is necessary. Thus, even though it is possible to employ the closed tube method, the cost of a quartz tube increases. Therefore, a less expensive method is desired.

The open tube method was developed as a vapor phase diffusion method for diffusing Zn into an InP epitaxial wafer having a diameter of 3 inches or 4 inches. The open tube method involves placing an n-type InP wafer inside a quartz tube that is open at both ends, and introducing a flow of a heated Zn compound into the tube such that Zn contacts the wafer and diffuses into the wafer from the surface thereof. This method uses a large quartz tube. A gas of a Group V element and a gas containing an impurity are introduced into the tube in a flowing fashion, with both ends of the tube being open, such that the wafer can be inserted into and removed from the tube through the opening. The Group V gas is for preventing disassociation of the Group V element contained in the wafer and is made to flow into the tube constantly in such a manner as to maintain an appropriate vapor pressure. Since the open method does not require the quartz tube to be broken after each diffusion process, the same apparatus can be used over and over again. It is also possible to manufacture a large apparatus. Thus, the open tube method is well suited to the vapor phase diffusion of larger diameter wafers. This open tube method, too, is an old method. In actual practice, however, it is difficult to control the diffusion conditions while maintaining the pressure balance of the Group V elements. Consequently, the open tube method is still not widely employed for p-type doping of InP wafers.

Another possibility is the solid phase diffusion method, which is also well suited to large wafers. The method is called "solid phase diffusion" because the diffusion source is a solid instead of a gas. The concept of solid phase diffusion has been around for a long time. Solid phase diffusion has a track record with Si, GaAs, and other semiconductors, but it still has hardly any track record at all with InP.

An example of how solid phase diffusion might be conducted with an InP photodiode will now be described. An SiN mask is attached to an InP epitaxial wafer, openings are formed in the mask, and a thin film of ZnO is formed over the mask with the openings. A layer is then provided on top of the ZnO for sealing, and the wafer is heated. As a result, the zinc atoms separate from the ZnO and thermally diffuse into the n-InP window layer and the n-InGaAs absorption layer of the wafer through the openings. The speed of the diffusion can be controlled by adjusting the temperature. When the desired degree of Zn diffusion is achieved, the wafer is removed from the furnace, and the ZnO layer that served as the solid diffusion source is removed with hydrofluoric acid. As a result, the ZnO and the SiN layers are removed and the InP window layer is exposed. When the wafer is viewed from above, the p-region appears as dots in a sea of n-type window layer. The p-region is allowed to remain, and an SiN layer is formed so as to cover the pn junction. Afterwards, a p-electrode is provided on the p-region and an n-electrode is provided on the n-type InP substrate.

[Patent Document 1] Japanese Patent Application Publication No. 2002-299679, "Photodiode Manufacturing Method"

Patent Document 1 addresses the issue of dislocations and defects that occur due to the difference in the thermal expansion rates of the solid diffusion layer (ZnO) and the epitaxial layers.

More specifically, when the p-region of an InP device is made using the solid phase diffusion method, a solid diffusion layer (ZnO) is formed directly on an epitaxial growth layer by vapor deposition, and heat is applied to cause the p-type dopant to diffuse from the diffusion layer to the epitaxial layers. The magnitudes of the thermal expansion rate and other physical constants of the solid diffusion layer (ZnO) containing the p-type impurities are substantially different from those of the epitaxial layer (InP, InGaAs), which contacts the solid diffusion layer from below. Consequently, dislocations and defects occur at the boundary between the two layers. If the defects and dislocations are large and numerous, the semiconductor device will incur such drawbacks as a large amount of leakage current. Patent Document 1 addresses this problem.

In the process disclosed in Patent Document 1, an n⁻-InP cap layer and an n⁻-InGaAs cap layer are epitaxially grown onto the uppermost layer (InGaAs contact layer) of the InP epitaxial growth layers. A mask is applied and the mask is partially etched to form openings. A ZnO diffusion source and an $SiO_2$ cap layer are then formed over the mask with the openings by sputtering. The resulting wafer is heat-treated such that the Zn diffuses from the ZnO diffusion source to the epitaxial layers through the n⁻-InP cap layer and the n⁻-InGaAs cap layer. After the diffusion is completed, the SiO cap layer, the ZnO cap layer, the p-InP cap layer, and the p-InGaAs cap layer are removed by etching.

In short, an n⁻-InP cap layer and an n⁻-InGaAs cap layer are formed thinly on the InP epitaxial layers (n-InP window layer/n-InGaAs/n-InP buffer/n-InP) and Zn is thermally diffused through the cap layers. Then, the ZnO, the p-InP, and the InGaAs cap layers are removed.

Here the difference between the lattice parameters of the n⁻-InP cap layer and the InGaAs contact layer, which is directly below the n⁻-InP cap layer, is small. On the other hand, the difference between the physical constants of the InP cap layer and the ZnO layer is large. Consequently, dislocations and defects occur between the InP cap layer and the ZnO layer, but do not reach the n-InGaAs contact layer below. Since the InP cap layer and the InGaAs cap layer are removed, the defects and dislocations are also removed. As a result, the defects do not remain in the device itself and a high-quality device can be obtained.

The cap layers (InP, InGaAs) are dummy layers that contact the ZnO layer and have lattice parameters and thermal expansion rates that are greatly different from those of the ZnO layer. Consequently, dislocations and defects occur between the ZnO layer and the cap layers (InP, InGaAs), and the defects and the dislocations multiply in the cap layers. However, the defects and dislocations are limited within the cap layers and do not extend to the epitaxial layers therebelow. Thus, the epitaxial layers have only a small amount of defects and dislocations. As a result, almost no leakage current occurs even if a large reverse bias is applied to the photodiode.

The object of the present invention is different from the object of Patent Document 1 and the two inventions are not closely related. The author has cited Patent Document 1 as a publicly known technology only because any more closely related document regarding the solid phase diffusion of Zn in the manufacture of an InP photodiode could not be found.

In a diffusion process in which Zn is diffused by the solid phase diffusion in order to manufacture an InP photodiode, an SiN or $SiO_2$ mask is formed on the epitaxial layers and a window is formed on a portion of the film. A ZnO film is formed over the mask with openings and an $SiO_2$ film is formed over the ZnO film. The wafer is then heated and Zn is allowed to diffuse from the ZnO into the epitaxial layers. The Zn is stopped and not allowed to diffuse into the epitaxial layers at the portions where the SiN or $SiO_2$ mask is formed. Meanwhile, the ZnO contacts the InP at the window portion of the mask. The heat causes the Zn to pass through the contact plane and move into the InP layer, such that Zn is diffused into the InP layer by heat. As a result, a p-region and a pn junction are formed in desired portions of the wafer surface corresponding to the window of the mask.

The diffusion of Zn with the solid phase diffusion works well thus far. However, unlike the vapor phase diffusion, the solid phase diffusion requires that the diffusion source (ZnO layer) be removed after the diffusion is completed. Since ZnO is an oxide film, it cannot be removed with such substances as sulfuric acid, hydrochloric acid, or caustic soda (sodium hydroxide). Hydrofluoric acid is used to remove the ZnO. However, although hydrofluoric acid can remove the ZnO, it also removes the SiN or $SiO_2$ of the mask and causes the pn junction to be temporarily exposed.

In both solid phase diffusion and vapor phase diffusion, the diffusion of Zn proceeds in an isotropic fashion through the crystal. Thus, the diffusion also advances laterally from the edge of the mask underneath the mask. Consequently, the portion of the pn junction on the uppermost surface is expanded from the pattern edge of the diffusion mask by several microns. The edge of the pn junction is directly underneath the mask and would remain protected by the mask if the mask was not removed. In the case of the vapor phase diffusion, the SiN or SiO$_2$ mask remains as a protective film. Thus, there is no concern regarding degradation of the pn junction because the pn junction is always protected. Also, in the case of the vapor phase diffusion, the mask remains and the spread of the p-region exists slightly beyond the mask opening. The vapor phase diffusion process results in self alignment, and all else that is required is to attach a p-electrode to the p-region.

Conversely, the solid phase diffusion method requires that the ZnO be removed with hydrofluoric acid. When the solid diffusion source is removed with hydrofluoric acid, the diffusion mask (SiO$_2$ or SiN) is also removed simultaneously. Thus, the protection of the mask is lost and the pn junction is completely exposed at the surface of the wafer. Since the wafer is outputted to the atmosphere after the etching, the gases and contaminants in the atmosphere contaminate the edge of the pn junction and cause the pn junction to become damaged.

The solid phase diffusion process will now be explained with reference to FIGS. 11 to 17. FIG. 11 is a cross sectional view showing a portion of an epitaxial InP wafer corresponding to a single device. An n-InP buffer layer 2, an n$^-$-InGaAs absorption layer 3, an n-InP window layer 4 are epitaxially grown onto an n-InP substrate 1. Here, "n$^-$-InGaAs" means the layer is n-type but its concentration is low. Since the InGaAs is n-type even if it is undoped, "n$^-$-InGaAs" includes undoped InGaAs. In some cases, the uppermost n-InP window layer 4 is not provided. In actual practice a multitude of chips are formed vertically and horizontally in a single wafer. Here, however, only the portion corresponding to a single device is depicted.

Figure 13:
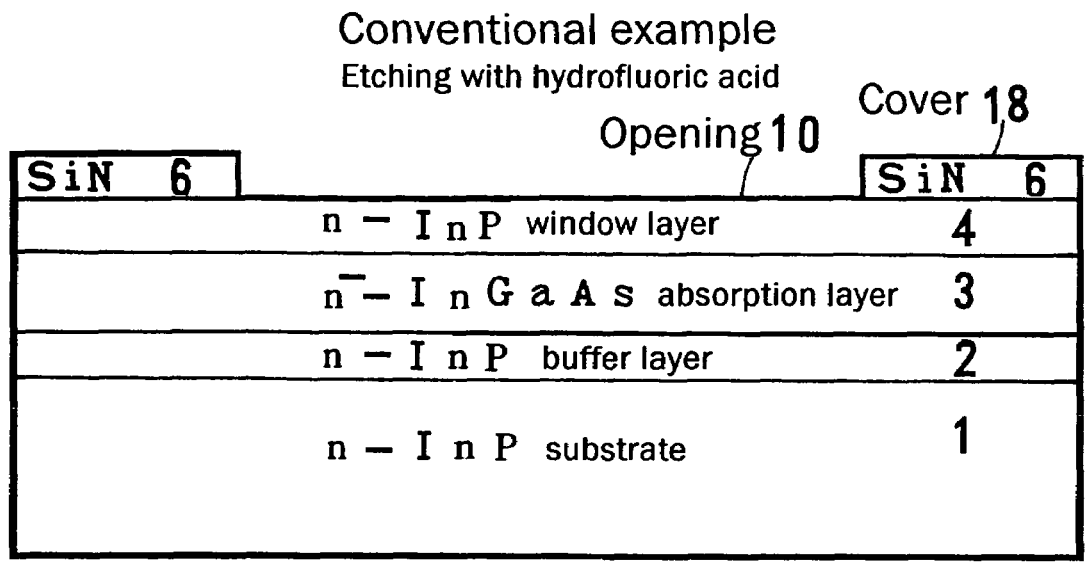

An SiN film 6 is formed on the epitaxial wafer as shown in FIG. 12. The SiN film 6 serves as a cover that will prevent the Zn from diffusing into the epitaxial layers. A photoresist is coated, exposed through a mask, and developed. In this manner, a window is formed in the photoresist. The SiN film 6 in the window portion of the photoresist is removed by etching, more specifically, by wet etching with hydrofluoric acid. As a result, an opening 10 is formed in a central portion of the device as shown in FIG. 13.

A thin ZnO film 8 serving as the Zn source is formed over the opening 10 and the SiN film cover 18. A thin SiO$_2$ film 9 is formed over the ZnO film 8. The SiO$_2$ film 9 on the ZnO film 8 prevents the Zn from escaping upward.

Figure 14:
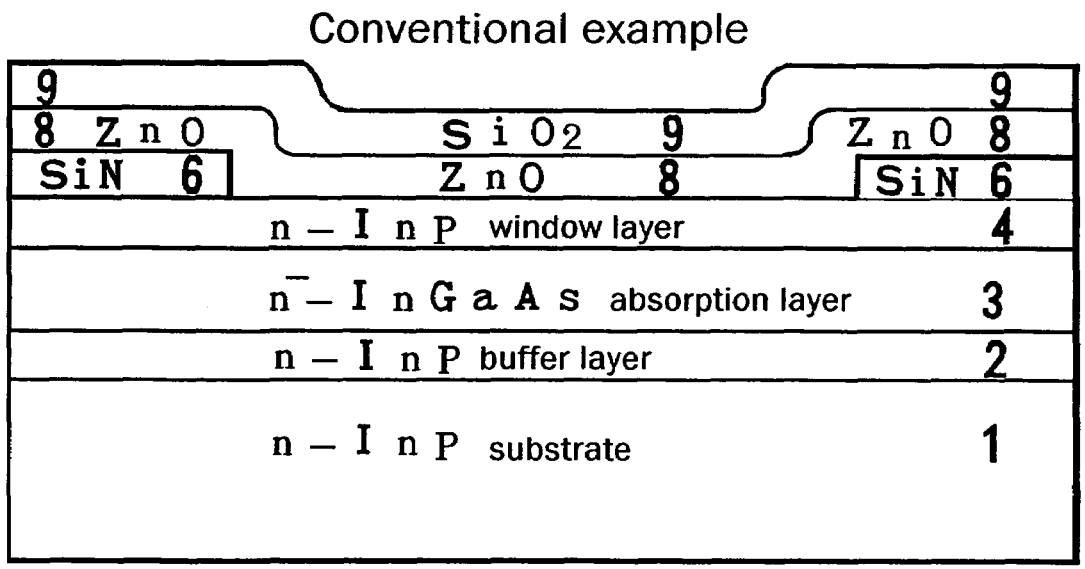

FIG. 14 shows the state of a single device of the wafer after the SiO$_2$ film 9 is formed. In the opening 10 area, the ZnO film 8 and the InP window layer are in contact. The sections where the cover exists, the ZnO film 8 and the InP window layer 4 are separated by the SiN film 6. The InP wafer is then heated and held at an appropriate temperature such that the Zn diffuses by thermal diffusion. The Zn atoms of the ZnO film 8 diffuse into the epitaxial layers of the wafer from the surface of the n-InP window layer 4 due to the concentration difference.

Figure 15:
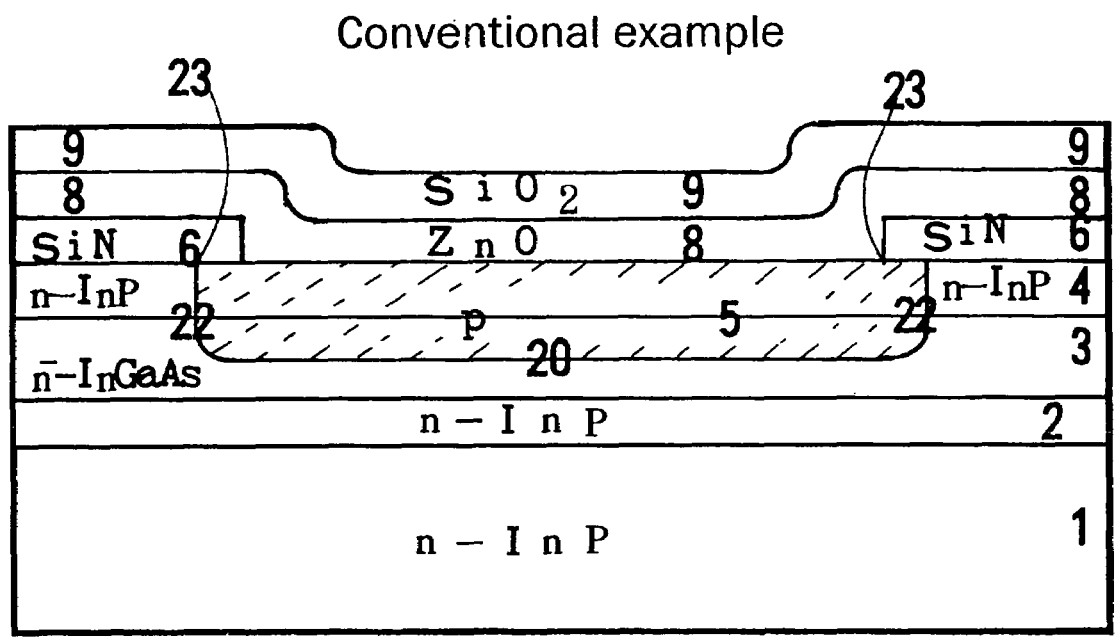

The Zn cannot diffuse into the SiN layer 6 and, thus, only diffuse into the InP window layer 4. The Zn atoms move not only directly downward but also laterally under the SiN mask 6. Once the Zn atoms pass through the n-InP window layer 4, they enter the n$^-$-InGaAs absorption layer 3 underneath. The Zn atoms then penetrate farther into the n$^-$-InGaAs absorption layer 3. This is the solid phase diffusion of Zn. After an appropriate amount of time has elapsed, the temperature is reduced and the diffusion is terminated. A pn junction 20 is thereby formed at a middle portion of the InGaAs absorption layer 3. The materials above the pn junction 20 turn into p-InP and p-InGaAs, while the material below the pn junction 20 is n-InGaAs. FIG. 15 is a cross sectional view showing a portion of the wafer corresponding to a single device when the diffusion is terminated.

A pn junction is a portion where the donor concentration and the acceptor concentration are the same. At the pn junction, free electrons and holes do not exist and the donors and acceptors are in an ionic state. Depletion layers form above and below the pn junction. The n-type depletion layer located directly below the pn junction is thick and is the more important of the two. When light incident on the device reaches the absorption layer 3, the light is absorbed because the band gap is small and electron-hole pairs are created. Due to the effect of the electric field, holes move toward the pn junction and pass the pn junction. When the holes enter the p-region, it means an electric current is generated and, thus, a photocurrent is generated.

The pn junction 20 is formed so as to be horizontal within the absorption layer 3. The portion of the pn junction 20 underneath the mask has a pn junction side wall 22. The edge 23 of the pn junction 20 is exposed in a portion of the n-InP window layer. When the vapor phase diffusion is used, the pn junction edge 23 is not exposed to the outside because the SiN mask is not removed. Conversely, with the solid phase diffusion, the pn junction edge 23 is temporarily exposed because the hydrofluoric acid etching used to remove the SiO$_2$/ZnO thin films also removes the SiN. Herein lies the problem with the solid phase diffusion method.

Figure 16:
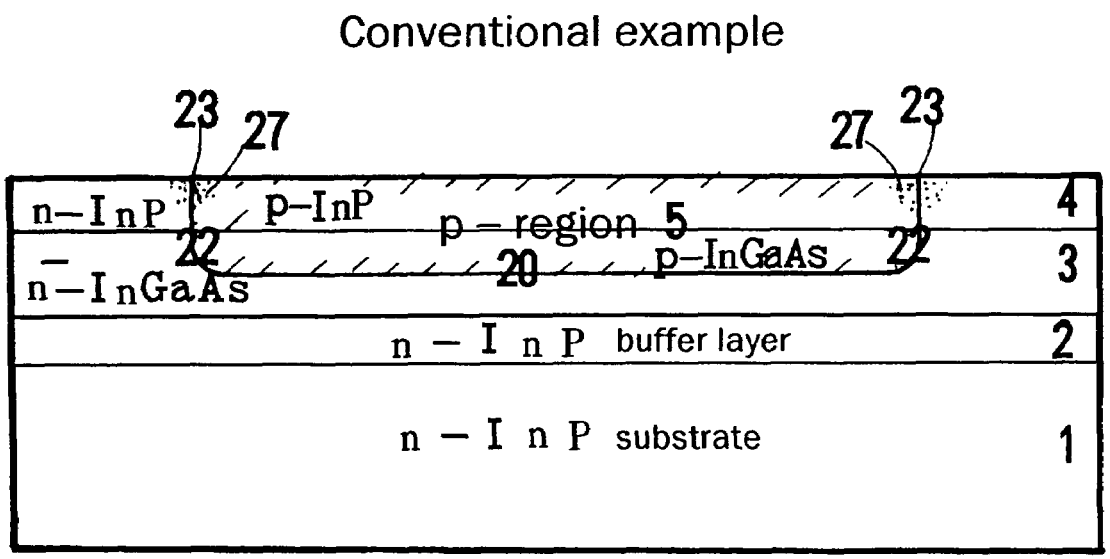

FIG. 16 shows the state of a single device of the wafer after the ZnO and SiN have been removed and the pn junction edge 23 is exposed. The pn junction edge 23 is vulnerable to contamination, since water vapor, oxygen, and the like tend to adhere to the pn junction edge 23. Defects 27 such as dislocations may result. When localized defects 27 occur, the pn junction is degraded and incomplete. It is a drawback of the solid phase diffusion that the state shown in FIG. 16 tends to occur. This state does not occur when the vapor phase diffusion is employed because the SiN is always attached.

With the solid phase diffusion, it is necessary to remove the SiO$_2$ and the ZnO diffusion source by etching. Since ZnO is strong oxide, it cannot be dissolved with sulfuric acid, phosphoric acid, hydrochloric acid, or caustic soda. Hydrofluoric acid must be used to remove ZnO. Although ZnO can be dissolved with hydrofluoric acid, the SiN is also removed simultaneously. In short, there is no etching liquid that can dissolve the ZnO without dissolving the SiN.

Thereafter, an SiN protective layer 36 is formed to cover the edge 23 of the pn junction 20. Since this SiN protective layer 36 is formed afterwards, the edge thereof is generally misaligned in the lateral and longitudinal directions relative to the pn junction edge 23. Due to the misalignment 29, the width by which the pn junction edge 23 is covered differs at different portions of the pn junction edge 23. Thereafter, a p-electrode and an n-electrode are formed. If the protective layer 36 is misaligned, the positioning of the p-electrode with respect to the p-region may also become misaligned.

SUMMARY OF THE INVENTION

The present invention uses an amorphous silicon (a-Si) layer as an upper layer to serve as a windowed mask for covering the epitaxial layers, such that the mask is not removed when the ZnO film is removed using hydrofluoric acid. It is preferable to provide an under layer of an SiN film, an $SiO_2$ film, an AlN film, an $Al_2O_3$ film, or an SiON film or the like beneath the upper layer of the a-Si film, so as to obtain a dual film.

In the present invention, a windowed mask of an a-Si film is provided as the uppermost layer on an epitaxial InP wafer. A thin ZnO film is formed over the mask and a cover layer of $SiO_2$, SiON, SiN or the like is formed over the ZnO film. The wafer is then heated such that the Zn escapes from the ZnO film and moves into the epitaxial InP wafer by thermal diffusion, thereby forming a p-region directly below the mask window. Hydrofluoric acid or buffered hydrofluoric acid is then used to remove the cover layer and the ZnO film. The a-Si film mask remains and the covered state of the pn junction edge is maintained. Since the a-Si film mask covers the pn junction constantly, there is no time when the pn junction is exposed to the outside. After the cover layer and the ZnO film are removed, a p-electrode is formed on the p-region and an n-electrode is formed on the back of the n-InP substrate. Hydrofluoric acid (HF) is a strong acid that can corrode $SiO_2$. Buffered hydrofluoric acid is hydrofluoric acid to which ammonium fluoride has been added to reduce the action of the hydrofluoric acid, and which has a buffering function. The ratio of ammonium fluoride to hydrofluoric acid is modifiable. For example, a solution mixed at the following ratios can be used: $HF:NH_4F:H_2O=1:10:30$. Since the etching action is diminished due to the ammonium fluoride, the etching rate is smaller than in the case of hydrofluoric acid alone is used.

BRIEF DESCRIPTIONS OF THE DRAWINGS

FIG. 1 is a cross sectional view of a portion of an InP wafer corresponding to a single device, in which an SiN thin film 6 and an a-Si thin film 7 are formed by the PCVD (plasma enhanced chemical vapor deposition) method on an InP epitaxial wafer that includes an n-InP substrate 1, an n-InP buffer layer 2, an n⁻-InGaAs absorption layer 3, and an n-InP window layer 4 during the application of a Zn solid phase diffusion method in accordance with an embodiment of the present invention.

FIG. 2 is a cross sectional view of a portion of an InP wafer corresponding to a single device, in which the SiN thin film 6 and a-Si thin film 7 are formed by the PCVD method on the InP epitaxial wafer, a mask is formed with a resist, and selective etching is performed with a mixed acid of hydrofluoric acid and nitric acid so as to remove a portion of the SiN thin film 6 and a-Si thin film 7 in the middle section of the device, during the application of the Zn solid phase diffusion method in accordance with the embodiment of the present invention.

FIG. 3 is a cross sectional view of the portion of the InP wafer corresponding to a single device shown in FIG. 2, in which a ZnO film 8 serving as a Zn source and an $SiO_2$ film 9 serving as a retaining film to prevent the upward escape of Zn are formed over the device.

Figure 4:
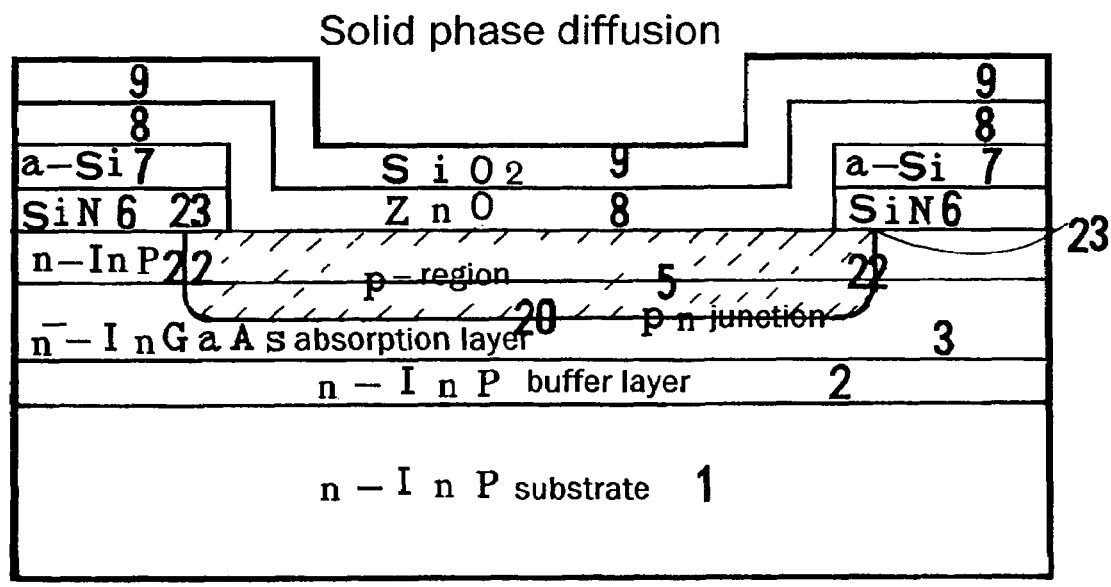

FIG. 4 is a cross sectional view of a portion of an InP wafer corresponding to a single device in which the SiN thin film 6 and a-Si thin film 7 are formed by the PCVD method on the InP epitaxial wafer, the mask is formed with the resist, selective etching is performed with the mixed acid of hydrofluoric acid and nitric acid to remove a portion of the SiN film 6 and a-Si film 7 in the middle section of the device, and the ZnO film 8 that serves as a Zn source and the $SiO_2$ film 9 that serves as a retaining film to prevent the upward escape of Zn is formed over the device, the wafer is heated to cause Zn to thermally diffuse from the ZnO film 8 so as to form a p-region in a portion of the InP window layer 4 and the InGaAs absorption layer 3, during the application of the Zn solid phase diffusion method in accordance with the embodiment of the present invention.

Figure 5:
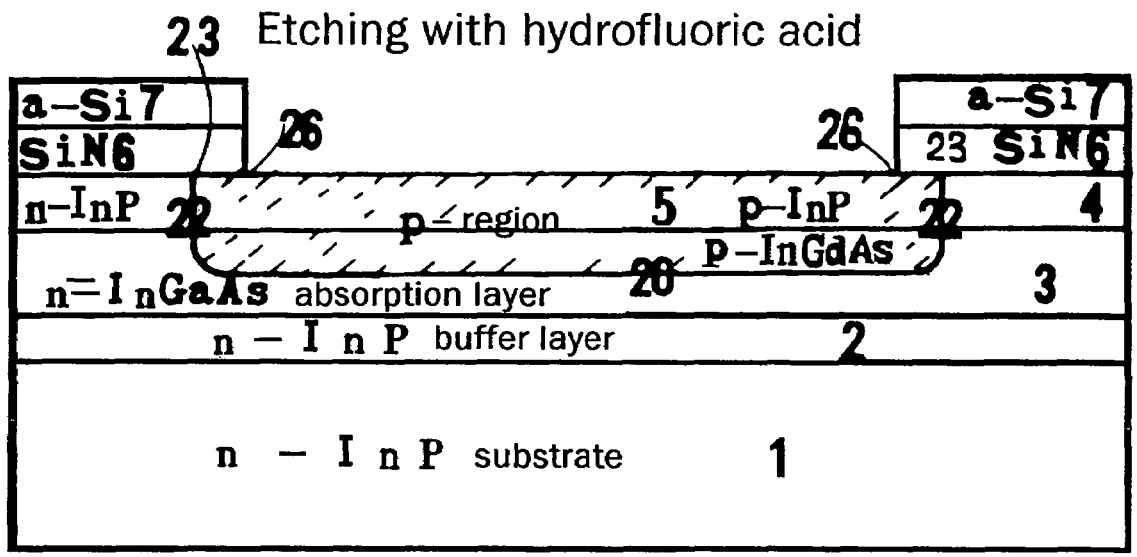

FIG. 5 is a cross sectional view illustrating the portion of the wafer corresponding to a single device, in which after the $SiO_2$ film 9 and the ZnO film 8 is removed and the p-region is exposed. The edge of the pn junction is covered by the SiN film.

Figure 6:
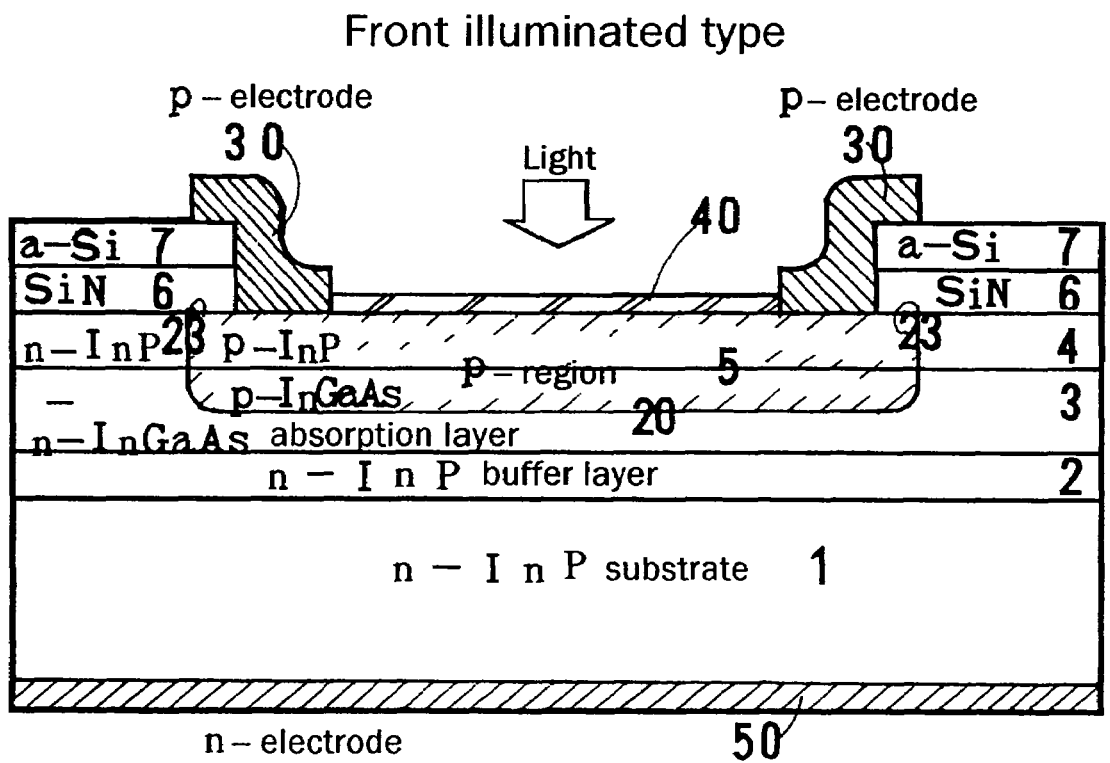

FIG. 6 is a cross sectional view of a front illuminated type photodiode fabricated using a Zn solid phase diffusion method in accordance with the embodiment of the present invention, in which the photodiode having a p-electrode 30 and an antireflective film 40 are formed over the p-region and an n-electrode 50 is formed on the bottom surface of the n-InP substrate.

Figure 7:
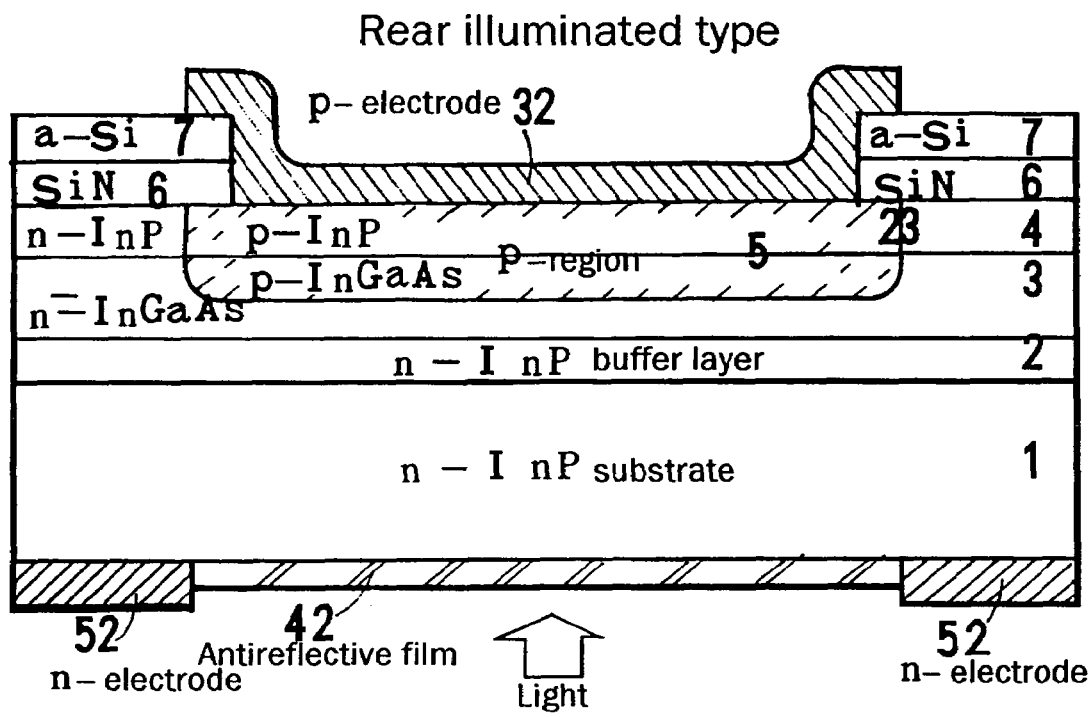

FIG. 7 is a cross sectional view of a rear illuminated type photodiode manufactured using a Zn solid phase diffusion method in accordance with the embodiment of the present invention, in which an SiN thin film 6 and an a-Si thin film 7 are on an InP epitaxial wafer using the PCVD method, a mask is formed with a resist, selective etching is performed with a mixed acid of hydrofluoric acid and nitric acid so as to remove a portion of the SiN thin film 6 and a-Si thin film 7 in the middle section of the device, a ZnO film 8 that serves as a Zn source and an $SiO_2$ film 9 that serves as a retaining film are formed to prevent the upward escape of Zn over the device, the wafer is heated such that the Zn thermally diffuses from the ZnO film 8 and forms a p-region in a portion of the InP window layer 4 and the InGaAs absorption layer 3, the $SiO_2$ film 9 and the ZnO film 8 are removed by hydrofluoric acid etching, a blind p-electrode 32 is formed over the entire surface of the p-region, an n-electrode 52 having an opening is formed on the bottom surface of the n-InP substrate, and an antireflection film 42 is provided in the opening.

Figure 8:
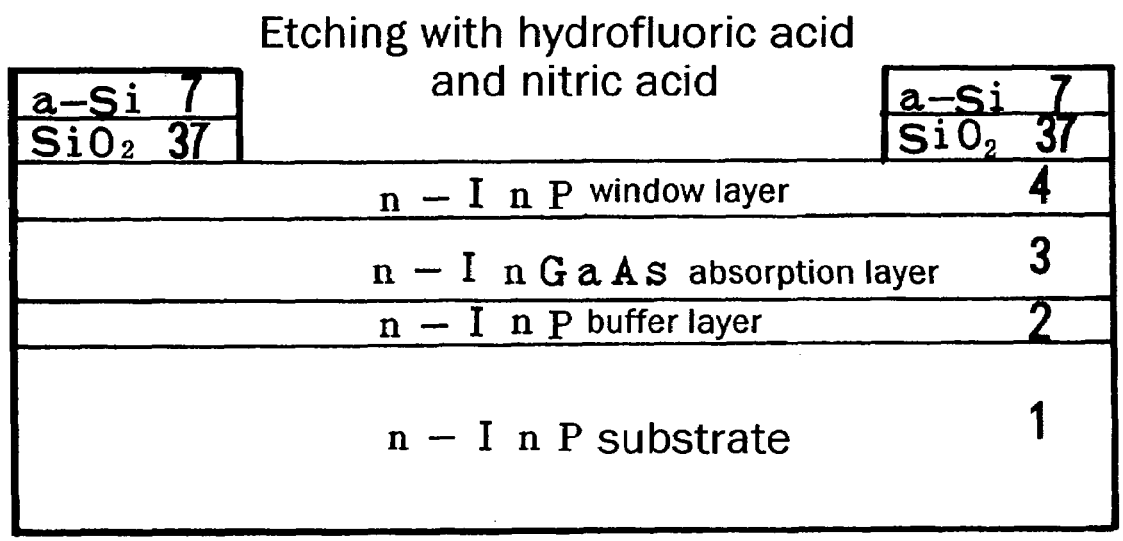

FIG. 8 is a cross sectional view of a portion of an InP epitaxial wafer corresponding to a single device, in which an $SiO_2$ thin film 37 and an a-Si thin film 7 are formed by the PCVD method on the InP epitaxial wafer, a mask is formed with a resist, selective etching is performed with a mixed acid of hydrofluoric acid and nitric acid so as to remove a portion of the $SiO_2$ thin film 37 and a-Si thin film 7 in the middle section of the device, during the application of a Zn solid phase diffusion method in accordance with another embodiment of the present invention.

Figure 9:
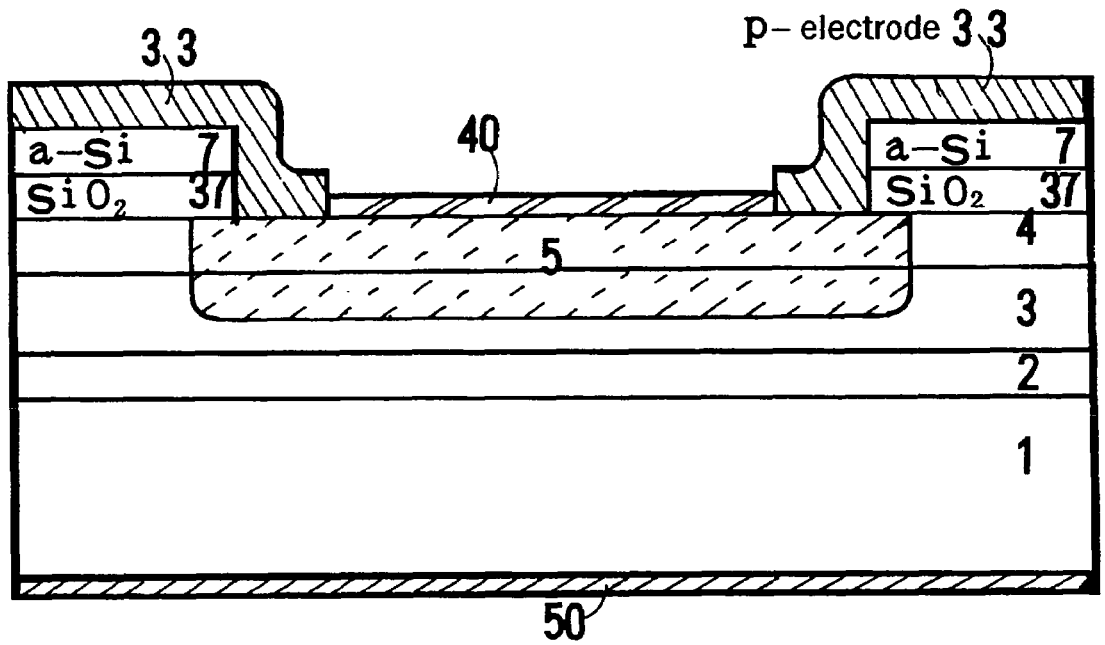

FIG. 9 is a cross sectional view of a front illuminated type photodiode fabricated by forming a ZnO thin film and an $SiO_2$ film on the device shown in FIG. 8, thermally diffusing the Zn, removing the ZnO film and $SiO_2$ film, forming a p-electrode 33 that has an opening in the middle and covers the entire perimeter section of the upper side of the wafer, and forming an n-electrode 50 on the bottom surface of the n-InP substrate.

Figure 10:
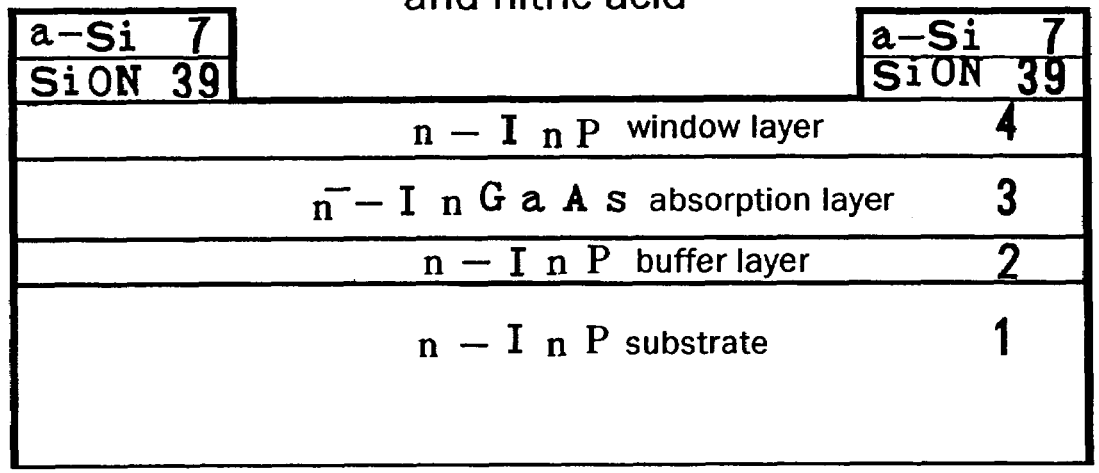

FIG. 10 is a cross sectional view of a portion of an InP epitaxial wafer corresponding to one device, in which an SiON thin film 39 and an a-Si thin film 7 are formed by the PCVD method on the InP epitaxial wafer, a mask is formed with a resist, selective etching is performed with a mixed acid of hydrofluoric acid and nitric acid so as to remove a portion of the a-Si thin film 7 and SiON thin film 39 in the middle section of the device during the application of a Zn solid phase diffusion method in accordance with still another embodiment of the present invention.

FIG. 11 is a cross sectional view of a portion of an InP epitaxial wafer corresponding to a single device, in which an n-InP buffer layer 2, an n⁻-InGaAs absorption layer 3, and an n-InP window layer 4 are epitaxially grown on an n-InP substrate 1.

FIG. 12 is a cross sectional view of a portion of an InP epitaxial wafer corresponding to a single device, in which an SiN thin film 6 is formed on an InP epitaxial wafer that includes an n-InP substrate 1, an n-InP buffer layer 2, an n⁻-InGaAs absorption layer 3, and an n-InP window layer 4, FIG. 12 explaining an example of a conventional solid phase diffusion method,.

FIG. 13 is a cross sectional view of a portion of an InP epitaxial wafer corresponding to a single device, in which an SiN thin film 6 is formed on the InP epitaxial wafer, a portion of the SiN film 6 at a middle section of the device is selectively removed by etching with hydrofluoric acid, FIG. 13 explaining an example of a conventional solid phase diffusion method.

FIG. 14 is a cross sectional view of a portion of an InP epitaxial wafer corresponding to a single device, in which an SiN thin film 6 is formed on the InP epitaxial wafer and a portion of the SiN film 6 at a middle section of the device is selectively removed by etching with hydrofluoric acid, a ZnO thin film 8 and an SiO₂ film 9 are formed on the SiN film 6, FIG. 14 explaining an example of a conventional solid phase diffusion method.

FIG. 15 is a cross sectional view of a portion of an InP epitaxial wafer corresponding to the device shown in FIG. 14, in which the device is heated and Zn thermally diffuses from the ZnO film 8 to the inside of the InP wafer so as to form a p-region 5 in a portion of the wafer.

Figure 17:
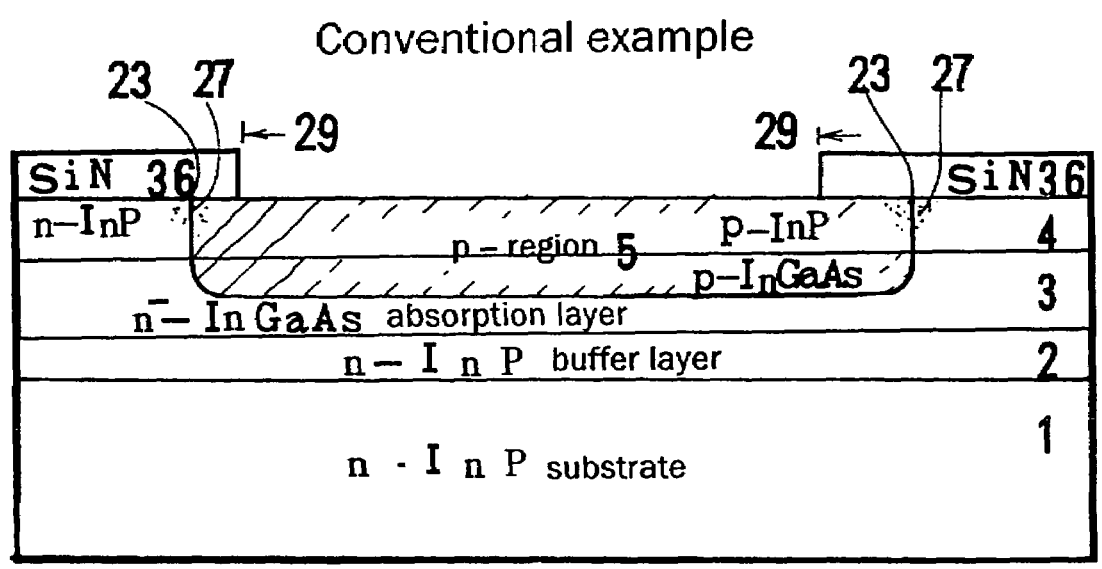

FIG. 16 is a cross sectional view of a portion of an InP epitaxial wafer corresponding to a single device, in which an SiN thin film is formed on the InP epitaxial wafer, a portion of the SiN film at a middle section of the device is selectively removed by etching with hydrofluoric acid, a ZnO thin film and an SiO₂ film are formed thereon, and the wafer has been heated such that the Zn thermally diffuses from the ZnO film to the inside of the InP wafer so as to form a p-region in a portion of the wafer, and the SiO₂ thin film and ZnO film are removed by hydrofluoric acid etching, such that the edge of the pn junction is exposed, FIG. 16 explaining an example of a conventional solid phase diffusion method, FIG. 17 is a cross sectional view of a portion of an InP epitaxial wafer corresponding to a single device, an SiN thin film 36 is formed on the InP epitaxial wafer, a portion of the SiN film 36 at a middle section of the device is selectively removed by etching with hydrofluoric acid, a ZnO film and an SiO₂ film are formed thereon, the wafer is heated such that the Zn thermally diffuses from the ZnO to the inside of the InP wafer so as to form a p-region in a portion of the wafer, and the SiO₂ thin film and ZnO film are removed by hydrofluoric acid etching, such that the SiO₂ film is formed on a perimeter section so as to cover the edge of the pn junction, FIG. 17 explaining an example of a conventional solid phase diffusion method.

DETAILED DESCRIPTION OF THE INVENTION

Since a-Si does not dissolve in hydrofluoric acid, the a-Si remains and protects the pn junction even after the ZnO thin film is removed with hydrofluoric acid. Since a-Si is used instead of crystalline Si, it is easy to form a thin film of approximately 100 nm (50 to 300 nm) by the PCVD method or another method. The a-Si is used as an upper layer, while various options are available for an under layer, such as SiN, SiO₂, SiON, and AlN. It is most preferable to form the under layer and the upper layer inside the same apparatus in a continuous fashion without ever breaking the vacuum. For example, SiO₂ might be applied by the PCVD method, and SiN might also be applied by the PCVD method. If the films are formed in a continuous manner without breaking the vacuum, there will not be any contamination between the lower and upper layers. Thus, good adhesion will be obtained between the layers. Of course, it is also acceptable to use a non-sequential deposition process, in which the under layer is formed by the CVD, the vapor deposition, or the sputtering, and the a-Si is applied by PCVD after the wafer is temporarily removed from the apparatus.

A combination of a-Si and SiN is most preferred. SiN is also used as the mask material where Zn is diffused by the vapor phase diffusion. SiN has an excellent ability to block the diffusion of Zn. A-Si is not strongly effective at suppressing the diffusion of Zn. Thus, by using a combination of SiN and a-Si, a Zn diffusion deterrent function and a hydrofluoric acid resistance function can be obtained simultaneously.

A combination of a-Si and SiO₂ is also preferred. SiO₂ dissolves in hydrofluoric acid, but is not affected by the hydrofluoric acid since it is covered with a-Si. SiO₂ is also capable of preventing the diffusion of Zn.

However, since both a-Si and SiO₂ transmit near-infrared light, when a combination of these two materials is used as the mask around the perimeter of the p-electrode, it is possible that near-infrared noise enters the device through the perimeter section. Such noise can be prevented from entering from the p-side of the device by forming the p-electrode over the entire surface of the perimeter section.

Other combinations that can be used as a two-layered mask include a-Si and SiON, a-Si and AlN, and a-Si and Al₂O₃. In each of these cases, the mask is not vulnerable to corrosion by hydrofluoric acid because a-Si is provided as the upper surface layer. Also, in each of these cases, the diffusion of Zn can be prevented.

Embodiment 1 (a-Si/SiN: FIGS. 1 to 7)

FIG. 1 is a cross sectional view of a portion of an InP epitaxial wafer corresponding to a single device, on which a two-layer mask layer having a surface layer of a-Si (amorphous silicon) and an under layer of SiN is formed. The InP epitaxial wafer includes an n-InP substrate 1, on which an n-InP buffer layer 2, an InGaAs absorption layer 3, and an n-InP window layer 4 are epitaxially grown.

The thickness of the InP substrate portion is approximately 200 to 400 μm, the thickness of the InP buffer layer is approximately 0.3 to 2.2 μm, the thickness of the InGaAs absorption layer is approximately 2.5 to 4 μm, and the thickness of the InP window layer is approximately 1 to 2.5 μm. These are shown in FIG. 11.

The SiN layer 6 and the a-Si layer 7 that form the diffusion mask layer are applied by the PCVD method. The SiN film is a material that is used to prevent the diffusion of Zn in the vapor phase diffusion, and is also utilized in the solid phase diffusion. The a-Si layer provided over the SiN layer is the novel idea of the present invention.

In this embodiment, the SiN layer is 100 nm thick and the a-Si layer is also 100 nm thick. It is acceptable if the a-Si layer has any thickness between 50 nm and 300 nm. The uppermost layer is made of a-Si because a-Si does not dissolve in hydrofluoric acid.

The new conception of the present invention is based on this arrangement. If the a-Si layer is thinner than 50 nm, the a-Si layer may not be able to withstand the corroding effect of the hydrofluoric acid due to variances in the thickness. If the a-Si layer is thicker than 300 nm, it may have poor adhesion with respect to the under layer.

The thickness of the SiN layer is also between 50 nm and 300 nm. The adhesion with respect to the epitaxial layer will degrade if the SiN layer is too thick. Thus, the thickness must be thinner than 300 nm.

Lithography is used to open windows in portions of the a-Si layer 7 and the SiN layer 6 where the p-region 5 is to be formed. More specifically, a resist is applied over the entire surface of the epitaxial wafer, the wafer is exposed to a mercury lamp through the mask and developed, and the resist is partially removed and partially allowed to remain. The mask (a-Si and SiN layers) is then etched using an etching liquid made of hydrofluoric acid and nitric acid. The hydrofluoric acid can dissolve the SiN but it cannot dissolve the a-Si. Thus, a window cannot be formed in the a-Si with hydrofluoric acid alone. Therefore, a mixed acid of hydrofluoric acid and nitric acid is used. Such mixed acid can dissolve a-Si. Since SiN dissolves in hydrofluoric acid alone, the mixed acid is sufficient to open a window through the portion of the a-Si/SiN film in the opening of the resist. When the resist is removed, a diffusion mask having an opening is obtained.

FIG. 2 shows the state of the wafer after the resist is removed. An opening 10 is obtained in a middle portion of the device and the n-InP window layer 4 is exposed to the outside through the opening 10. The diameter of the opening 10 is approximately 50 to 200 μm. One side of the device is 390 μm in this embodiment.

The a-Si/SiN film remains around a perimeter section of the device and serves as a cover 19 for the perimeter section. Thus, openings 10 (InP window layer) are formed in a dispersed manner on the cover 19 at the surface of the InP wafer.

A ZnO thin film 8 is formed over the mask (cover 19) and the InP layer (opening 10) by sputtering. The thickness of the ZnO thin film 8 is 100 nm in this embodiment. The thickness is adjusted between 30 nm and 300 nm depending on the desired diffusion amount.

The ZnO thin film 8 is the solid phase Zn diffusion source. Since Zn is to be diffused, one might think that either Zn alone or a zinc compound could be used, but the Zn does not diffuse into the InP very readily when Zn alone is used. ZnO is the best suited solid diffusion source for Zn. ZnO is an oxide and remains strong at high temperatures. It also has good adhesion with respect to InP. Zinc chloride ($ZnCl_2$) evaporates when heated. ZnS and ZnSe are zinc compounds that can withstand high temperatures. However, there is a possibility that when S and Se (selenium) enter the InP, they may act as n-type impurities and form donors that cancel out with accepters. Accordingly, S and Se are not well suited to formation of a p-type region. With ZnO, the oxygen does not enter the InP, and thus a p-type region can be formed.

Next, an $SiO_2$ thin film 9 is formed over the ZnO film 8 by sputtering. This $SiO_2$ film 9 serves as a retaining film that serves to prevent Zn from being discharged upward from the ZnO film. In an example, the $SiO_2$ film 9 is approximately 100 nm thick, but any thickness between 30 nm and 300 nm is acceptable. FIG. 3 is a cross sectional view showing the ZnO thin film and the $SiO_2$ thin film thus formed.

Then, the wafer is heated to 480° C. to 540° C., and the Zn is allowed to diffuse from the ZnO into the InP window layer. The diffusion is conducted for approximately 30 minutes.

FIG. 4 is a view at the stage. The Zn atoms move into the InP window layer 4 and the InGaAs absorption layer 3 due to the difference in concentration of Zn. The thickness of the Zn diffusion layer is approximately 1.9 to 2.2 μm. The Zn also migrates underneath the SiN mask 6. The Zn diffusion is conducted until the pn junction 20 is positioned in the approximate middle of the absorption layer 3. In addition to a horizontal section 20, the pn junction has a sidewall section 22 which is underneath the SiN mask. A pn junction edge 23 is also located underneath the SiN mask.

When the diffusion has progressed to a prescribed depth, the heating is stopped and the wafer is cooled. Thereafter, the $SiO_2$ thin film 9 and the ZnO thin film 8 are etched with hydrofluoric acid. Although hydrofluoric acid can dissolve $SiO_2$, ZnO, and SiN, the SiN does not dissolve here because it is covered with a-Si. The hydrofluoric acid dissolves and removes the layers of $SiO_2$ and ZnO. This state is illustrated in FIG. 5. A central portion of the InP window layer is made into a p-type InP layer, while a central portion of the InGaAs is made into a p-InGaAs layer. The pn junction edge 23 is protected because it is underneath the SiN mask 6. The pn junction 23 is never exposed to the outside. This is the aim of the present invention. The pn junction edge 23 is protected and, thus, does not degrade or develop dislocations or defects. Consequently, the pn junction is protected.

The technique of this invention can be applied to both front illuminated and rear illuminated photodiodes.

FIG. 6 shows a device that has been made into a front illuminated photodiode. A p-electrode 30 is attached to the top of the p-region 5. An anti-reflection film 40 is formed on an opening. An n-electrode 50 is provided on the back surface of the n-InP substrate 1. Signal light passes through the anti-reflection film 40 and enters the device from the p-region side thereof. The protective film on the p-side of the device is a two-layered film made of a-Si and SiN.

FIG. 7 shows a device that has been made into a rear illuminated photodiode. A p-electrode 32 is attached to the p-region 5 entirely. A ring-shaped n-electrode 52 is provided on the back surface of the n-InP substrate 1. An anti-reflection film 42 is formed on the opening of the back surface. Signal light passes through the anti-reflection film 42 and enters the device on the n-region side thereof. The protective film on the p-side of the device is a two-layered film made of a-Si and SiN.

Embodiment 2 (a-Si/$SiO_2$: FIGS. 8 and 9)

The main point of the present invention is to use a diffusion prevention mask that is resistant to hydrofluoric acid. This can be accomplished by forming a mask that has an upper layer made of a-Si and a thin film capable of deterring Zn diffusion as an under layer. In this embodiment, a dual film of a-Si and $SiO_2$ will be described.

FIG. 8 is a cross sectional view of a portion of an InP epitaxial wafer corresponding to a single device. A two-layered patterned mask layer having an a-Si thin film 7 and an $SiO_2$ thin film 37 is formed over the wafer, a pattern is formed, and a portion of the two-layered mask layer corresponding to a middle portion of the device is etched with a mixed acid of hydrofluoric acid and nitric acid. Hydrofluoric acid alone cannot dissolve a-Si. A-Si cannot be dissolved unless a mixed acid of hydrofluoric acid and nitric acid is used.

The SiO$_2$ thin film 37 and a-Si film 7 that constitute the diffusion mask layer are formed by the PCVD method. The SiO$_2$ thin film can deter the Zn diffusion from ZnO. Meanwhile, since a-Si does not dissolve with hydrofluoric acid, the a-Si/SiO$_2$ mask is not removed when the ZnO is etched with hydrofluoric acid. It is for these reasons that the a-Si/SiO$_2$ film can be used as a Zn diffusion preventing film.

Since both a-Si and SiO$_2$ are transparent relative to near-infrared light, the a-Si/SiO$_2$ film cannot deter noise light. Where there is no possibility of noise light entering from the perimeter section of the device, it is acceptable to provide the p-electrode that covers the perimeter section only partially. However, where there is a possibility of noise light entering the photodiode from the perimeter section, the p-electrode should be extended along the perimeter section. By providing a wide p-electrode 33, the intrusion of noise from the perimeter section can be prevented. An example of such a wide p-electrode 33 is shown in FIG. 9. Since the p-electrode 33 extends to the edge of the device, there is no risk of noise light entering from the top surface of the perimeter section.

Embodiment 3 (a-Si/SiON: FIG. 10)

The main proposal of the present invention is to use a diffusion prevention mask that is resistant to hydrofluoric acid. This can be accomplished by forming a mask that has an upper layer made of a-Si and a thin film capable of deterring Zn diffusion as an under layer. There are still other materials that are suitable for use as the under layer. In this embodiment, a dual film of a-Si and SiON is will be explained. FIG. 10 is a cross sectional view of a portion of an InP epitaxial wafer corresponding to a single device. A two-layered patterned mask layer having an a-Si thin film 7 (upper layer) and an SiON thin film 39 (under layer) is formed over the wafer, a pattern is formed, and a portion of the two-layered mask layer corresponding to a middle portion of the device is etched with a mixed acid of hydrofluoric acid and nitric acid. Hydrofluoric acid alone cannot dissolve a-Si. A-Si cannot be dissolved unless a mixed acid of hydrofluoric acid and nitric acid is used.

The SiON thin film 39 and a-Si film 7 that constitute the diffusion mask layer are formed by the PCVD method. The SiON thin film can also deter the diffusion from ZnO. Meanwhile, a-Si does not dissolve in hydrofluoric acid (including buffered hydrofluoric acid) and thus prevents the a-Si/SiON mask from being removed when ZnO is etched. Furthermore, SiON can prevent Zn diffusion. It is for these reasons that a-Si/SiON film can be used as a Zn diffusion preventing film.

As the sizes of InP wafers increase to 3 inch, 4 inch from the conventional 2-inch size, it becomes difficult to process the wafers by using the closed tube method of Zn vapor phase diffusion. It is difficult conduct a task in which large quartz tubes are manufactured, a vacuum is created, and Zn diffusion is conducted. Moreover, the cost of the closed tube method becomes an issue because large-sized quartz tubes must be manufactured, and because the quartz tubes must be broken and cannot be reused. The present invention relates to a solid phase diffusion method and is advantageous with respect to cost because it does not require quartz tubes to be broken. Another advantage of the present invention is that it is easy to make the apparatus larger. Since the diffusion mask is not removed when the ZnO diffusion source is removed by etching, the edge of the pn junction is protected by the mask at all times, and defects do not occur at the edge of the pn junction. With the present invention, it is possible to manufacture a photodiode that has little leakage current or dark current. Additionally, the present invention makes it easier to control the thickness of the pn junction, and a thinner p-region can be made with ease.

What is claimed is:

1. A zinc solid phase diffusion method for an InP-based photodiode, for selectively diffusing zinc on an epitaxial wafer as a p-type impurity that forms a pn junction in an absorption layer, the epitaxial wafer having an n-type InP substrate on which at least an n-type InGaAs absorption layer made of or an n-type InGaAsP absorption layer is epitaxially grown, the zinc solid phase diffusion method comprising:
   forming on the epitaxial wafer a selective diffusion mask that has an upper layer made of a-Si;
   forming a ZnO thin film, which is a zinc source, over the selective diffusion mask;
   forming an SiO$_2$ film or an SiN film over the ZnO thin film to serve as a retaining film that prevents zinc from escaping upward;
   heating the epitaxial wafer and allowing zinc from the ZnO thin film to diffuse with solid phase diffusion until zinc reaches the absorption layer;
   removing the retaining film and the ZnO thin film using hydrofluoric acid or buffered hydrofluoric acid;
   allowing the selective diffusion mask having an upper layer made of a-Si to remain for protecting the pn junction.

2. The zinc solid phase diffusion method for an InP-based photodiode recited in claim 1, wherein
   the selective diffusion mask has a two-layered structure including an upper layer made of a-Si and an under layer made of SiN.

3. The zinc solid phase diffusion method for an InP-based photodiode recited in claim 1, wherein
   the selective diffusion mask has a two-layered structure including an upper layer made of a-Si and an under layer made of SiC$_2$.

4. The zinc solid phase diffusion method for an InP-based photodiodes recited in claim 1, wherein
   the selective diffusion mask has a two-layered structure including an upper layer made of a-Si and an under layer made of SiON.

5. The zinc solid phase diffusion method for an InP-based photodiodes recited in any one of claims 1 to 4, wherein
   an etching liquid used to manufacture the selective diffusion mask having the upper layer made of a-Si is a mixed acid of hydrofluoric acid and nitric acid.

6. The zinc solid phase diffusion method for an InP-based photodiode recited in any one of claims 1 to 4, wherein
   the selective mask having the upper layer made of a-Si is formed in by a sequential deposition.

7. The zinc solid phase diffusion method for an InP-based photodiodes recited in claim 5, wherein
   the selective diffusion mask having the upper layer made of a-Si is formed by a sequential deposition.

8. An InP-based photodiode, comprising:
   an n-type InP substrate;
   an n-type InP buffer layer, an n$^-$-type InGaAs or InGaAsP absorption layer, and an n-type InP window layer that are epitaxially grown on the n-type InP substrate;
   a p-type region formed by solid phase deposition of zinc into a central section of the window layer and the absorption layer;
   a pn junction that is formed in an intermediate portion of the absorption layer and has an edge part in the InP window layer;

a protective layer that is provided so as to cover the pn junction edge part and a perimeter section of the n-type InP window layer, the protective layer having a two-layered structure of a-Si and SIN;

a p-electrode formed on the p-type region; and an n-electrode formed on a bottom surface of the n-type InP substrate.

9. An InP-based photodiode, comprising:

an n-type InP substrate;

an n-type InP buffer layer, an n⁻-type InGaAs or InGaAsP absorption layer, and an n-type InP window layer that are epitaxially grown on the n-type InP substrate;

a p-type region formed by solid phase deposition of zinc into a central section of the window layer and the absorption layer;

a pn junction that is formed in an intermediate portion of the absorption layer and has an edge pan in the InP window layer;

a protective layer that is provided so as to cover the pn junction edge part and a perimeter section of the n-type InP window layer, the protective layer having a two-layered structure of a-Si and $SiO_2$;

a p-electrode formed on the p-type region; and an n-electrode formed on a bottom surface of the n-type InP substrate.

10. An InP-based photodiode, comprising:

an n-type InP substrate;

an n-type InP buffer layer and an n⁻-type InGaAs or InGaAsP absorption layer that are epitaxially grown on the n-type InP substrate;

a p-type region formed by solid phase deposition of zinc into a central section of the absorption layer;

a pn junction that is formed in an intermediate portion of the absorption layer;

a protective layer that is provided so as to cover the pn junction edge part and a perimeter section of the n⁻-type InGaAs or InGaAsP absorption layer, the protective layer having a two-layered structure of a-Si and SiN;

a p-electrode formed on the p-type region; and an n-electrode formed on a bottom surface of the n-type InP substrate.

11. An InP-based photodiode comprising:

an n-type InP substrate;

an n-type InP buffer layer and an n⁻-type InGaAs or InGaAsP absorption layer that are epitaxially grown on the n-type InP substrate;

a p-type region formed by solid phase deposition of zinc into a central section of the absorption layer;

a pn junction that is formed in an intermediate portion of the absorption layer;

a protective layer that is provided so as to cover the pn junction edge part and a perimeter section of the n⁻-type InGaAs or InGaAsP absorption layer, the protective layer having a two-layered structure of a-Si and $SiO_2$;

a p-electrode formed on the p-type region; and an n-electrode formed on a bottom surface of the n-type InP substrate.

12. An InP-based photodiode, comprising:

an n-type InP substrate;

an n-type InP buffer layer, an n⁻-type InGaAs or InGaAsP absorption layer, and an n-InP window layer that are epitaxially grown on the n-type InP substrate;

a p-type region formed by solid phase deposition of zinc into a central section of the window layer and the absorption layer;

a pn junction that is formed in an intermediate portion of the absorption layer and has an edge part in the InP window layer;

a protective layer that is provided so as to cover the pn junction edge part and a perimeter section of the n-type InP window layer, the protective layer having a two-layered structure of a-Si and SiON;

a p-electrode formed on the p-type region; and an n-electrode formed on a bottom surface of the n-type InP substrate.

13. An InP-based photodiode, comprising:

an n-type InP substrate;

an n-type InP buffer layer and an n⁻-type InGaAs or InGaAsP absorption layer that are epitaxially grown on the n-type InP substrate;

a p-type region formed by solid phase deposition of zinc into a central section of the absorption layer;

a pn junction that is formed in an intermediate portion of the absorption layer;

a protective layer that is provided so as to cover the pn junction edge part and a perimeter section of the n⁻-type InGaAs or InGaAsP absorption layer, the protective layer having a two-layered structure of a-Si and SiON;

a p-electrode formed on the p-type region; and an n-electrode formed on a bottom surface of the n-type InP substrate.

* * * * *